United States Patent [19]

Seki et al.

[11] 4,403,240

[45] Sep. 6, 1983

[54] INTEGRATED CIRCUIT WITH AT LEAST THREE GROUND PADS

[75] Inventors: Kunio Seki, Hinode; Ritsuji Takeshita, Hino, both of Japan

[73] Assignee: Hitachi, Ltd., Tokyo, Japan

[21] Appl. No.: 200,459

[22] Filed: Oct. 24, 1980

[30] Foreign Application Priority Data

Oct. 26, 1979 [JP] Japan ................................. 54-137645

[51] Int. Cl.³ ...................... H01L 27/04; H01L 23/50
[52] U.S. Cl. ........................................ 357/48; 357/65; 330/307
[58] Field of Search ....................... 357/48, 68, 65, 84, 357/85; 307/303; 330/295, 307

[56] References Cited

U.S. PATENT DOCUMENTS 3,688,132 8/1972 Gill et al. ............................. 357/48

FOREIGN PATENT DOCUMENTS 1251454 10/1971 United Kingdom ..

OTHER PUBLICATIONS

National Semiconductor Corp. Linear Data Book, Jun. 1976, p. 10-51, LM384.
Murari, "Power Integrated Circuits . . . ", IEEE J. of Solid-State Circuits, vol. SC-13, No. 3, Jun. 1978, pp. 307-319.

*Primary Examiner*—William D. Larkins
*Attorney, Agent, or Firm*—Antonelli, Terry & Wands

[57] ABSTRACT

A semiconductor integrated circuit device for an amplifier circuit including a semiconductor substrate in which an audio amplifier circuit is formed in an integrated circuit form, at least one first wire bonding pad which is formed on said semiconductor substrate to ground said audio amplifier circuit, and an externally connecting terminal which is provided being separated away from said semiconductor substrate and which is electrically connected to said first wire bonding pad via a metal wire, wherein the improvement comprises a wire bonding pad for the substrate which is formed on said semiconductor substrate being separated away from said first wire bonding pad, and which grounds said semiconductor substrate, and a metallic connector wire which electrically connects said wire bonding pad for the substrate to said externally connecting terminal.

15 Claims, 5 Drawing Figures

INTEGRATED CIRCUIT WITH AT LEAST THREE GROUND PADS

BACKGROUND OF THE INVENTION

The present invention relates to a semiconductor integrated circuit device (hereinafter referred to as IC) and, more specifically deals with an IC in which is formed an amplifier circuit.

In an IC having elements that are formed on a substrate, it is necessary that the substrate is fixed to ground potential so that the substrate is separated from the elements by the pn junction.

On the other hand, reference potential wiring (earth) of the circuit formed in the IC must be fixed to ground potential by providing on the substrate a wire bonding pad for grounding the circuit, and connecting the pad to an externally drawing lead of the IC (hereinafter often referred to as external connecting pin of the IC) using a metal connector.

In general, the number of external connecting pins of the IC is determined depending upon the package construction of IC. It is desired to minimize the number of external connecting pins (external connecting terminals) in the circuit which is produced in an integrated circuit form. From such a point of view, the wire bonding pad for grounding the circuit and the wire bonding pad for grounding the substrate had hitherto been formed on the substrate in the form of a common wire bonding pad, and the common pad had been connected to an external connecting pin of the IC via a metal connector so as to be maintained at ground potential of an electronic device which consists of a printed board or the like.

However, the inventors of the present invention have found the fact that when the IC is employed for an audio amplifier circuit, the distortion factor of the audio amplifier circuit is deteriorated by the internal resistance possessed by the metal connector which connects the common wire bonding pad to the external connecting pin. In other words, since a heavy current such as output current flows from a reference potential to ground potential in the circuit which is constructed in the form of an integrated circuit, the reference potential undergoes variation in the IC due to internal resistance possessed by the metal connector, whereby the potential of the substrate is also varied. Variation in the substrate potential caused by the output current deteriorates the distortion factor of the output in the audio amplifier circuit.

If illustrated in further detail in regard to the IC which contains an audio amplifier circuit having at least an output amplifier circuit portion and an input amplifier circuit portion, a reference potential line in the output amplifier circuit portion is separated from a reference potential line in the input amplifier circuit portion in the IC in order that the input side is not affected by the variation in the reference potential caused by a heavy current in the output amplifier circuit portion, and wire bonding pads and externally drawing leads are provided to individually ground them.

In this case, when the substrate is connected to the wire bonding pad for grounding in the output amplifier circuit, the output current flows through the metal connector on the output side and through the externally drawing lead. However, since the metal connector contains internal resistance, the reference potential line in the output amplifier circuit undergoes variation due to output current, and the substrate potential undergoes the variation as well. Variation in the substrate potential is fed back by a parasitic capacity which is formed between a region where the input-stage transistor is formed and the substrate in the above-mentioned region, and the thus fed-back signals are superposed on the input signals to deteriorate the distortion factor.

On the other hand, when the substrate is connected to the wire bonding pad for grounding in the input amplifier circuit, the leakage current flows into the substrate via a pnp lateral transistor which forms a generally employed quasicomplementary push-pull circuit. The leakage current flows through the metal connector on the input side and through the externally drawing lead. Here, since the metal connector contains resistance, the reference potential line in the input amplifier circuit portion is varied by the leakage current which flows into the substrate, and the distortion factor is deteriorated.

SUMMARY OF THE INVENTION

The object of the present invention therefore is to provide a semiconductor integrated circuit device for use in audio amplifier circuits, which helps decrease the distortion factor.

In order to restrain the variation of reference potential that will be transmitted to the substrate due to a current which flows from a grounding bonding pad connected to a reference potential of the audio amplifier circuit to ground potential, according to the present invention, a wire bonding pad is formed on the substrate to ground it being separated away from the above-mentioned wire bonding pad for grounding, and the wire bonding pad for grounding the substrate is connected to the grounded externally drawing lead (external connecting pin) through a second metal connector.

The invention will now be illustrated below concretely in conjunction with the accompanying drawings.

DETAILED DESCRIPTION OF THE INVENTION

Figure 1:
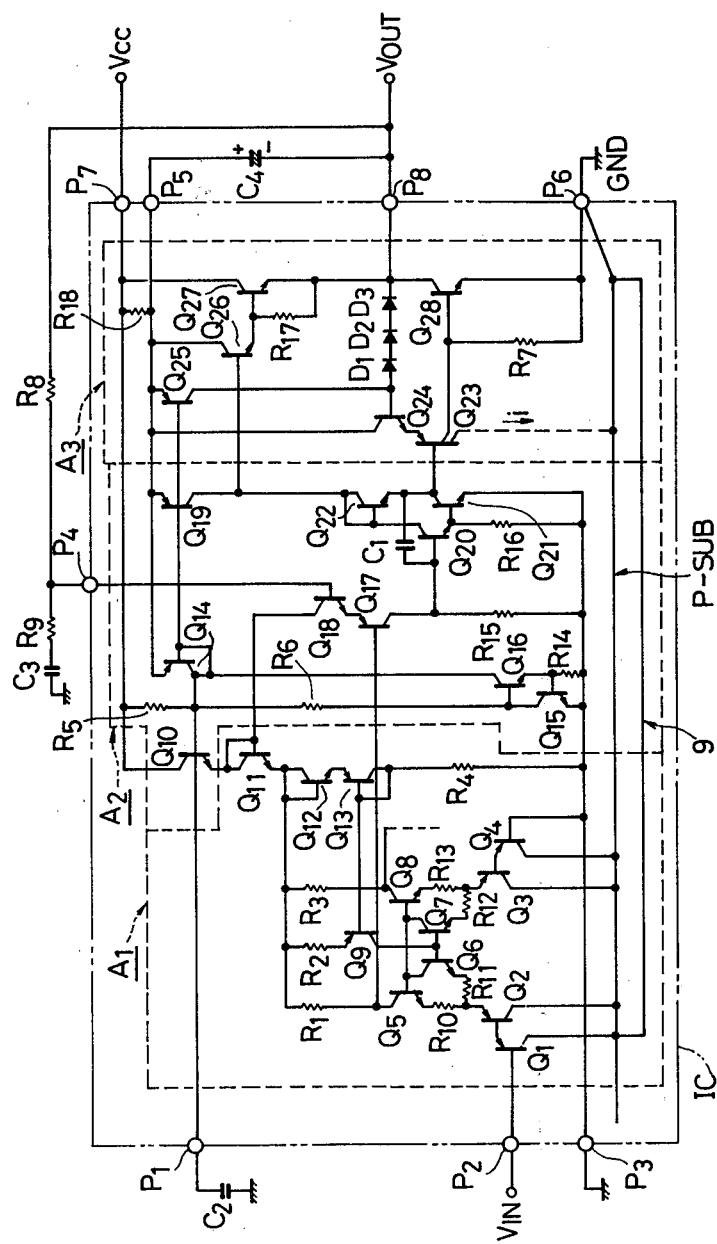
FIG. 1 is a circuit diagram of a semiconductor integrated circuit device according to the present invention.
Figure 2:
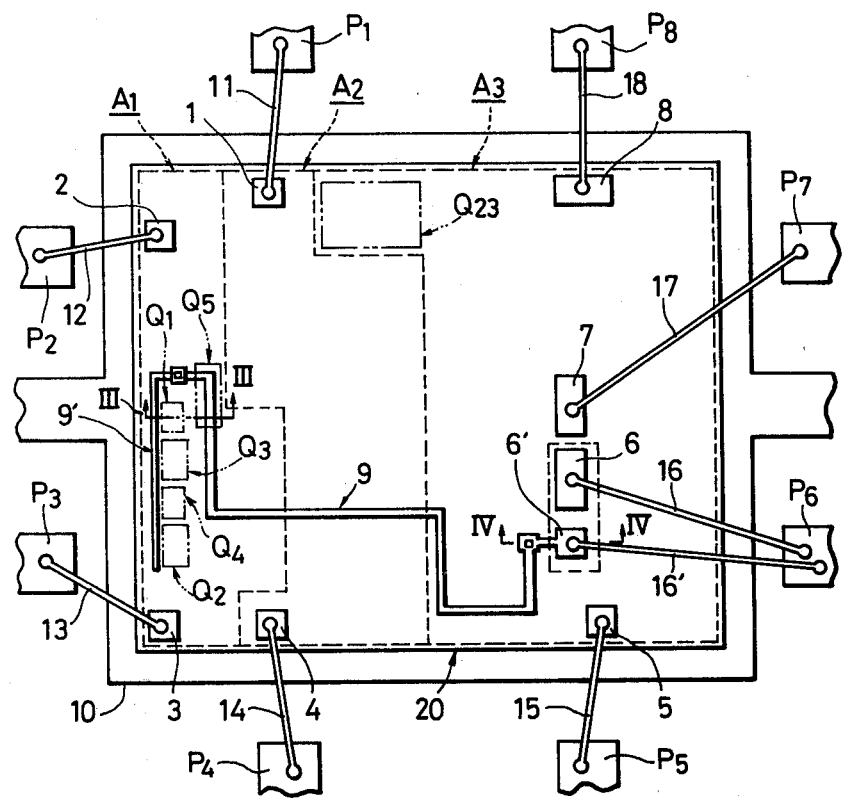
FIG. 2 is a plan view of the semiconductor integrated circuit device according to the present invention.

FIGS. 1 and 2 are diagrams illustrating the circuit and construction of the IC for audio amplifiers according to an embodiment of the present invention.

The IC is a so-called monolithic one which consists of a single silicon semiconductor substrate. The portion surrounded by a dot-dash line is formed in a semiconductor chip. Symbols $P_1$ to $P_8$ denote externally drawing leads, i.e., external connecting pins (external connecting terminals) that are provided in the package of IC.

The audio amplifier circuit which is constructed in the form of an integrated circuit of the present invention is illustrated below with reference to FIG. 1.

The audio amplifier circuit consists of an input amplifier circuit $A_1$ for amplifying the input signals, a drive circuit $A_2$ which receives the output of the input amplifier circuit and which drives a subsequent stage, and an output amplifier circuit $A_3$ which is driven by the drive circuit and which produces output signals.

The input amplifier circuit $A_1$ constitutes a differential amplifier circuit which includes pnp transistors $Q_1$ to $Q_4$, and is used as a buffer amplifier for the drive circuit $A_2$ which is connected in the subsequent stage.

Darlington-connected pnp transistors $Q_1$ and $Q_2$ are grounded at their collectors, and are served through their bases with input signals $V_{IN}$ that are introduced through an externally drawing lead $P_2$.

Similarly, Darlington-connected pnp transistors $Q_3$ and $Q_4$ are grounded at the collectors, and the base electrode of the transistor $Q_4$ is biased to 0 volt (ground potential).

Emitter electrodes of the transistors $Q_2$ and $Q_3$ are connected, respectively, to emitter electrodes of transistors $Q_5$ and $Q_6$ which constitute a differential amplifier through resistors $R_{10}$ and $R_{13}$.

Collector electrode of a constant-current transistor $Q_9$ is connected to commonly connected base electrodes of the transistors $Q_5$ and $Q_8$.

The base electrode of the constant-current transistor $Q_9$ is served with a constant voltage from diode-connected transistors $Q_{12}$ and $Q_{13}$ that are connected in series, whereby the collector electrode is served with a constant current which is determined by the resistor $R_2$ that is connected to the emitter electrode of the constant-current transistor $Q_9$. The constant current is supplied to the commonly connected bases of the transistors $Q_5$ and $Q_8$ which constitute the differential amplifier.

A power-source voltage $V_{cc}$ is applied to the commonly connected collector and base of the diode-connected transistor $Q_{12}$ via transistors $Q_{10}$ and $Q_{11}$. Similarly, the power-source voltage $V_{cc}$ is applied to the resistor $R_2$ that is connected to the emitter electrode of the constant-current transistor $Q_9$, and to load resistors $R_1$ and $R_3$ of the differential transistors $Q_5$, $Q_8$ via transistors $Q_{10}$ and $Q_{11}$.

The load resistors $R_1$ and $R_3$ are provided for the collectors of the differential transistors $Q_5$ and $Q_8$, in order to obtain amplified output signals of opposite phases.

Diode-connected transistors $Q_6$, $Q_7$ and resistors $R_{11}$, $R_{12}$ that are provided between the bases of the differential transistors $Q_5$, $Q_8$ and the emitters of the transistors $Q_2$, $Q_3$ so work that apparent current amplification factor of the differential transistors $Q_5$, $Q_8$ is set to be nearly 1.

The drive circuit $A_2$ consists of a biasing circuit which includes transistors $Q_{14}$ to $Q_{16}$, a differential circuit which includes a feed-back transistor $Q_{18}$, and a driver circuit which includes Darlington-connected transistors $Q_{20}$, $Q_{21}$, and drives the output amplifier circuit $A_3$ which is placed in the subsequent stage.

Emitter electrodes of a pnp transistor $Q_{17}$ and an npn transistor $Q_{18}$ are commonly connected, the collector electrode of the transistor $Q_{17}$ is grounded via a resistor $R_{15}$, and the collector electrode of the transistor $Q_{18}$ is connected to a connection point between the transistor $Q_{10}$ and the transistor $Q_{11}$.

One of the amplified outputs obtained from the input amplifier circuit $A_1$ is applied to the base electrode of the transistor $Q_{17}$, and an output signal is produced on the collector electrode of the transistor $Q_{17}$.

The transistor $Q_{18}$ works to feed back a direct current, and its base electrode is served with a middle-point potential of the output amplifier circuit $A_3$ via a feedback circuit which consists of resistors $R_8$, $R_9$ and a capacitor $C_3$ that are connected outside the IC, whereby the middle-point potential of the output amplifier circuit $A_3$ is controlled to a predetermined potential.

The above feedback circuit also works to negatively feed back alternating currents.

Referring to the Darlington-connected transistors $Q_{20}$ and $Q_{21}$, the base electrode of the transistor $Q_{20}$ is served with the output signal from the collector electrode of the transistor $Q_{17}$ of the differential circuit, and output signals are produced on the collector electrodes of the transistors $Q_{20}$ and $Q_{21}$ with the constant-current transistor $Q_{19}$ as the load.

A capacitor $C_1$ which is connected between the base electrode of the transistor $Q_{20}$ and the collector electrode of the transistor $Q_{21}$ works to prevent the oscillation.

The output amplifier circuit $A_3$ consists of a quasi-complementary push-pull circuit.

The Darlington-connected transistors $Q_{26}$ and $Q_{27}$ are served via their bases with the output signals of the drive circuit $A_2$, and produce positive a-c output signals on the emitter electrodes.

The transistor $Q_{28}$ for obtaining negative a-c outputs operate in a complementary manner with respect to the transistors $Q_{26}$ and $Q_{27}$, and is served with an output signal of the drive circuit $A_2$ via the pnp transistor $Q_{23}$ which forms an inverted input.

The diodes $D_1$ to $D_3$ and the transistor $Q_{24}$ constitute a circuit for biasing the output transistors $Q_{23}$, $Q_{28}$, $Q_{26}$ and $Q_{27}$.

An audio output signal is obtained from a point at which the emitter electrode of the transistor $Q_{27}$ is connected to the collector electrode of the transistor $Q_{28}$, via an externally drawing lead $P_8$.

In this circuit, reference potentials of the input amplifier circuit $A_1$ and the drive circuit $A_2$ are grounded via a grounding wire bonding pad 3 (FIG. 2) on the input side and via an externally drawing lead $P_3$, a reference potential of the output amplifier circuit $A_3$ is grounded via a grounding wire bonding pad 6 (FIG. 2) on the output side and via an externally drawing lead $P_6$, and the substrate is grounded via a wire bonding pad 6' (FIG. 2) for the substrate and via the externally drawing lead $P_6$.

The IC construction of the audio amplifier circuit (power IC) is illustrated in FIG. 2.

In FIG. 2, the same portions as those of FIG. 1 are denoted by the same symbols.

Referring to FIG. 2, a portion surrounded by a broken line $A_1$ denotes an input amplifier circuit portion, a portion surrounded by a broken line $A_2$ denotes a drive circuit portion, and a portion surrounded by a broken line $A_3$ denotes an output amplifier circuit portion.

Reference numerals 1 to 8 denote wire bonding pads which are connected to predetermined externally drawings leads $P_1$ to $P_8$ (external connecting pins) via metallic connector wires 11 to 18. Reference numeral 3 denotes a grounding wire bonding pad on the input side, and 6 denotes a grounding wire bonding pad on the output side.

Reference numeral 20 denotes a semiconductor chip, and 10 denotes a tub for securing the semiconductor chip 20.

Figure 3:
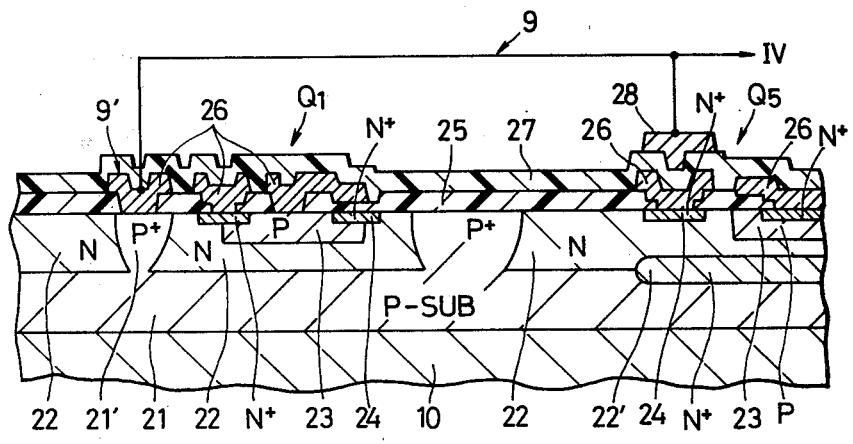
FIG. 3 is a cross-sectional view on an enlarged scale of the semiconductor integrated circuit device along the line III—III of FIG. 2.
Figure 4:
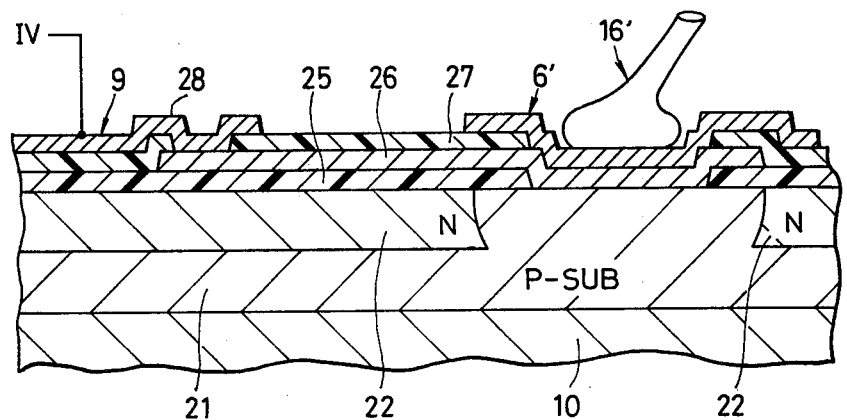
FIG. 4 is a cross-sectional view on an enlarged scale of the semiconductor integrated circuit device along the line IV—IV of FIG. 2.

FIG. 3 is a cross-sectional view of an enlarged scale of a pnp transistor forming region which is formed in the pnp amplifier circuit portion of the semiconductor chip along the line III—III of FIG. 2, and FIG. 4 is a cross-sectional view of an enlarged scale of the wire bonding pad for the substrate formed in the output amplifier circuit portion along the line IV—IV of FIG. 2.

In FIGS. 3 and 4, reference numeral 10 denotes a tub, 21 denotes a substrate (P-SUB), 22 denotes an n-type well region for forming elements that is separated from a p+-type isolation region 21' by the pn junction, 23 denotes a p-type region formed in the well region 22, 24 denotes an n+-type region formed in the well region 22 or in the p-type region 23, 25 denotes a first insulation layer, 26 denotes a first aluminum wiring which serves as an electrode for the elements that are formed on the substrate, and which is used for effecting predetermined circuit connection, 27 denotes a second insulation film which is provided on the first aluminum wiring, and 28 denotes a second aluminum wiring for effecting predetermined circuit wiring. The second aluminum wiring is insulated from the first aluminum wiring 26 by the second insulation film 27, and is connected to the first aluminum wiring 26 through holes that are formed in the second insulation film 27.

The first aluminum wiring 9' and the second aluminum wiring 9 are connected as shown in FIG. 3, and the extension thereof is connected to the aluminum wiring 9 of FIG. 4 as denoted by IV.

The pnp transistors $Q_1$ to $Q_4$ formed in the input amplifier circuit portion $A_1$ are the substrate-type pnp transistors in which the n-type well region 22 serves as a base region, the p-type region 23 serves as an emitter region, and the substrate 21 serves as a collector region.

The second aluminum wiring denoted by 6' serves as a wire bonding pad for the substrate, and 16' denotes a metallic connector wire for connecting the wire bonding pad 6' to the externally drawing lead $P_6$ which is grounded. The metallic connector wire 16' is composed, for example, of gold wire.

The substrate 21 is connected to the wire bonding pad 6' for the substrate via the first aluminum wiring, and is grounded.

According to the embodiment of the present invention illustrated in FIGS. 1 to 4, the output current from the output transistor $Q_{28}$ which constitutes the output amplifier circuit $A_3$ flows through the grounding wire bonding pad 6, the metallic connector wire 16 and the externally drawing lead $P_6$.

Therefore, the potential of the grounding wire bonding pad 6 varies relative to the potential of the externally drawing lead $P_6$, depending upon the resistance (for example, 50 miliohms) of the metallic connector wire 16.

According to the present invention, however, the grounding wire bonding pad 6 is connected to the externally drawing lead $P_6$ in such a manner that a wire bonding pad 6' for substrate is separately provided, and the wire bonding pad 6' for substrate is connected to the externally drawing lead $P_6$ through a second metallic connector wire 16'.

Since the wire bonding pad 6' for substrate is connected to the externally drawing lead $P_6$, variation in voltage is not transmitted to the substrate no matter how it is varied by the resistance in the metallic connector wire and the output current of the output circuit. Consequently, the potential in the substrate is not varied by the above-mentioned variation in voltage, and no variation is fed back to the input signals by the parasitic capacity which exists between the base region 22 of the pnp transistors $Q_1$ to $Q_4$ in the circuit portion $A_1$ and the substrate in the region where the pnp transistors $Q_1$ to $Q_4$ are formed. Therefore, the input signals can be prevented from being distorted.

Furthermore, a parasitic vertical transistor with its collector serving as a p-type substrate is formed in the pnp lateral transistor $Q_{23}$ which constitutes the output amplifier circuit $A_3$. When there is a leakage current i as indicated by a broken line in FIG. 1, the leakage current i flows from the substrate into ground potential via the wire bonding pad 6' for substrate, the metallic connector wire 16' and the externally drawing lead $P_6$, so that the potential in the substrate varies primarily due to the great resistance of the substrate. With reference to the pnp transistors $Q_1$ to $Q_4$ which are formed in the input amplifier circuit $A_1$ that is susceptible to the substrate potential, the substrate in the region where the pnp transistors $Q_1$ to $Q_4$ are formed is connected to the wire bonding pad 6' which is grounded through aluminum wirings 9' and 9 that have resistance which is very much smaller than that of the substrate.

Accordingly, the variation in the substrate in the retion where the pnp transistors of the input amplifier circuit are formed, is very little affected by the leakage current i which flows into the substrate of the pnp lateral transistor $Q_{23}$. Therefore, the input signals are less distorted by the feed back through the parasitic capacitance.

Furthermore, the wire bonding pad 6' to which is connected the substrate is provided being separated away from the grounding wire bonding pad 6 which is maintained at a reference potential of the output side and separated away from the grounding wire bonding pad 3 which is maintained at a reference potential on the input side. The wire bonding pad 6' is connected to the externally drawing lead $P_6$ on the output side. Therefore, the leakage current i which flows into the substrate, does not flow through the wire bonding pad 3 for grounding on the input side, through the metallic connector wire 13 or through the externally drawing lead $P_3$ on the input side. Consequently, the reference potential (ground) lines of the input amplifier circuit $A_1$ and the drive circuit $A_2$ are not varied by the resistance of the metallic connector wire 13 or of the externally drawing lead $P_3$; the input signals can be prevented from being distorted.

Figure 5:
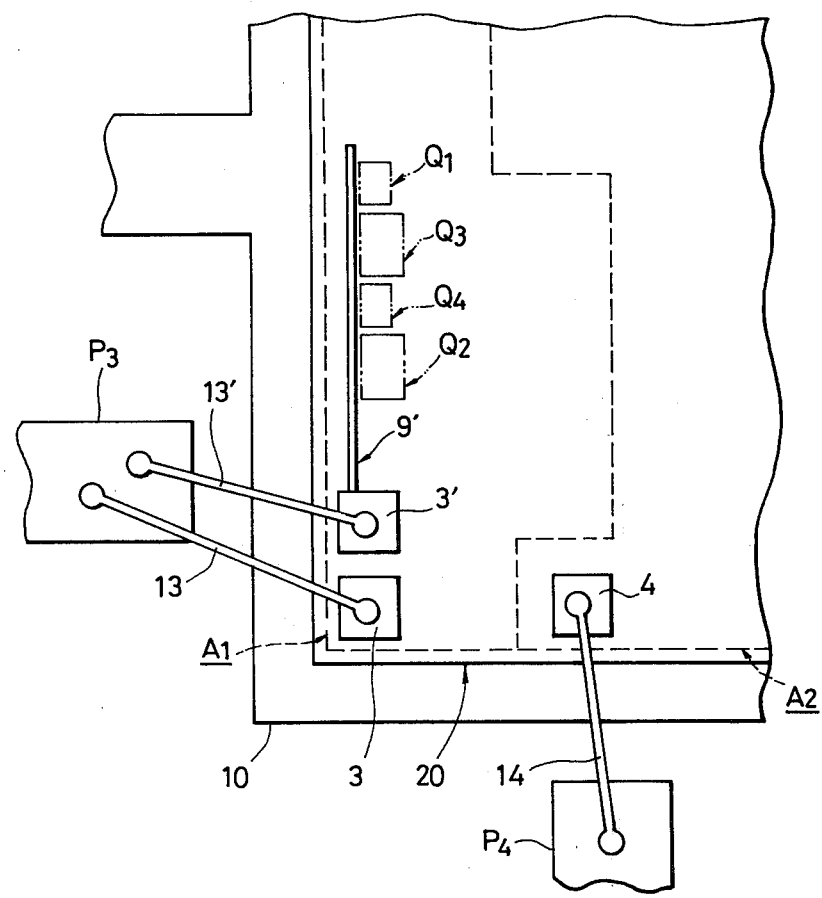
FIG. 5 is a plan view of the semiconductor integrated circuit device according to another embodiment of the present invention.

FIG. 5 illustrates another embodiment of the present invention in the audio amplifier circuit of FIG. 1, i.e., illustrates on an enlarged scale a portion of the semiconductor chip of the integrated circuit.

In FIG. 5, the same portions as those of FIGS. 1 to 4 are denoted by the same reference numerals.

In FIG. 5, reference numeral 4 denotes a grounding wire bonding pad to which is connected the reference potential of the input amplifier circuit $A_1$ and the drive circuit $A_2$, $P_3$ denotes an externally drawing lead which is connected to the ground potential, 13 denotes a metallic connector wire which connects the grounding wire bonding pad 3 to the externally drawing lead $P_3$, 9' denotes a first aluminum wiring which is connected to the substrate, 3' denotes a wire bonding pad for substrate which is connected to the first aluminum wiring, and 13' denotes a metallic connector wire which connects the wire bonding pad 3' for substrate to the externally drawing lead $P_3$.

The wire bonding pad 3' to which is connected the substrate is separated from the grounding wire bonding pads 3 and 6 on the input side and on the output side, and is connected to the externally drawing lead $P_3$ via the metallic connector wire 13'.

Therefore, even when the output current of the transistor $Q_{28}$ in the output amplifier circuit $A_3$ flows through the metallic connector wire 16 and through the externally drawing lead $P_6$, the substrate potential does not undergo variation, and the input signals are not distorted.

Further, when the leakage current i flows from the pnp lateral transistor $Q_{23}$ which constitutes the output amplifier circuit $A_3$ into the substrate, the potential varies very little in the substrate in the region where the pnp transistors $Q_1$ to $Q_4$ of the input amplifier circuit $A_1$ are formed, and the input signals are prevented from being distorted, since the substrate in the region where the pnp transistors $Q_1$ to $Q_4$ of the input amplifier circuit $A_1$ are formed is grounded via the first aluminum wiring 9', via the metallic connector wire 13' and via the externally drawing lead $P_3$ on the input side, that have resistances which are extremely smaller than the resistance of the substrate between the region where the pnp lateral transistor $Q_{23}$ is formed and the region where the pnp transistors $Q_1$ to $Q_4$ are formed.

The present invention is in no way limited to the above-mentioned embodiments only, but can be modified in a variaty of ways.

For example, even when the pnp transistor in the input amplifier circuit $A_1$ is a lateral pnp transistor, variation in the substrate potential is fed back to the input signals by the parasitic capacity between the base region and the substrate. By applying the present invention, however, the distortion can be avoided.

In addition to the audio amplifier circuits, the present invention can be adopted to all monolithic integrated circuits that are formed on a semiconductor chip which includes wire bonding pads, metallic connector wires and externally drawing leads.

What is claimed is:

1. In a semiconductor integrated circuit device for audio amplifier circuits including a semiconductor substrate, first and second semiconductor island regions formed on said semiconductor substrate, an input amplifier circuit formed in said first semiconductor island region, an output amplifier circuit formed in said second semiconductor island region, a first wire bonding pad which is formed on said semiconductor substrate for grounding said input amplifier circuit and a first externally connecting terminal which is provided being separated away from said semiconductor substrate and which is electrically connected to said first wire bonding pad via a first metal wire to ground said input amplifier circuit, the improvement comprising a second wire bonding pad which is formed on said semiconductor substrate being separated away from said first wire bonding pad for grounding said output amplifier circuit, a second externally connecting terminal which is provided being separated away from said semiconductor substrate and which is electrically connected to said second wire bonding pad via a second metal wire to ground said output amplifier circuit, a third wire bonding pad which is formed in the vicinity of the second semiconductor island region on said semiconductor substrate being separated away from said first and second wire bonding pads for grounding said semiconductor substrate, and a third metal wire which electrically connects said third wire bonding pad to said second externally connecting terminal to ground said semiconductor substrate.

2. A semiconductor integrated circuit device for audio amplifier circuits according to claim 1, wherein said device further comprises an element forming region for forming a PNP transistor that constitutes said input amplifier circuit, said element forming region being formed in said first semiconductor island region, and a connection wiring which electrically connects the semiconductor substrate in the vicinity of said element forming region to said third wire bonding pad.

3. A semiconductor integrated circuit device for audio amplifier circuits according to claim 2, wherein said connection wiring is electrically connected to said semiconductor substrate in the vicinity of said element forming region, and is composed of a metal layer which stretches on said semiconductor substrate between the element forming region and said third wire bonding pad.

4. A semiconductor integrated circuit device which comprises a semiconductor substrate, first and second semiconductor island regions formed on said semiconductor substrate, a first circuit element formed in said first semiconductor island region, a second circuit element formed in said second semiconductor island region, a first wire bonding pad formed on said semiconductor substrate and electrically connected to said first circuit element to provide a predetermined reference potential to said first circuit element, a second wire bonding pad formed on said semiconductor substrate and being electrically connected to said second circuit element to provide said reference potential to said second circuit element, a third wire bonding pad formed on said semiconductor substrate to provide said reference potential to said semiconductor substrate, and a conductive layer formed on said semiconductor substrate and electrically connected to said third wire bonding pad and said semiconductor substrate.

5. A semiconductor integrated circuit device according to claim 4, wherein said first circuit element constitutes a PNP transistor.

6. A semiconductor integrated circuit device according to claim 4, wherein said conductive layer is made of aluminum.

7. A semiconductor integrated circuit device which comprises a semiconductor substrate, first and second semiconductor island regions formed on said semiconductor substrate and separated away from each other by a semiconductor isolation region contacted with said semiconductor substrate, a first circuit element formed in said first semiconductor island region, a second circuit element formed in said second semiconductor island region, a first bonding pad formed on said semiconductor substrate and electrically connected to said first circuit element to provide a predetermined reference potential to said first circuit element, a second bonding pad formed on said semiconductor substrate and electrically connected to said second circuit element to provide said reference potential to said second circuit element, a third bonding pad formed on said semiconductor substrate to provide said reference potential to said semiconductor substrate, and a conductive layer formed on said semiconductor substrate and contacted with said third bonding pad, with a first portion of said semiconductor isolation region in the vicinity of said first circuit element and with a second portion of said semiconductor isolation region in the vicinity of said second circuit element.

8. A semiconductor integrated circuit device according to claim 7, wherein said conductive layer is made of aluminum.

9. A semiconductor integrated circuit device which comprises a semiconductor substrate, first and second semiconductor island regions formed on said semiconductor substrate and separated away from each other by a semiconductor isolation region contacted with said semiconductor substrate, a first amplifier circuit formed in said first semiconductor island region, a second amplifier circuit formed in said second semiconductor island region, a first connecting pad which is formed on said semiconductor substrate for grounding said first amplifier circuit, a first externally connecting terminal which is provided being separated away from said semiconductor substrate and which is electrically connected to said first connecting pad to ground the first amplifier circuit, a second connecting pad which is formed on said semiconductor substrate being separated away from said first connecting pad for grounding said second amplifier circuit, a second externally connecting terminal which is provided being separated away from said semiconductor substrate and which is electrically connected to said second connecting pad to ground said second amplifier circuit, a third connecting pad which is formed on said semiconductor substrate being separated away from said first and second connecting pads, and a conductive layer formed on said semiconductor substrate and contacted with said third connecting pad, and which is also contacted with a first portion of said semiconductor isolation region in the vicinity of said first semiconductor island region and with a second portion of said semiconductor isolation region in the vicinity of said second semiconductor island region, and wherein said third connecting pad is electrically contacted to said second externally connecting terminal to ground said semiconductor substrate.

10. A semiconductor integrated circuit device according to claim 9, wherein said first and second amplifier circuits constitute input and output amplifier circuits, respectively.

11. A semiconductor integrated circuit device according to claim 9, wherein said first and second amplifier circuits constitute output and input amplifier circuits, respectively.

12. A semiconductor integrated circuit device according to claim 9, 10 or 11, wherein said conductive layer is made of aluminum.

13. A semiconductor integrated circuit device which comprises a semiconductor substrate which is of a first conductivity type and has one main surface, a semiconductor layer which is of a second conductivity type opposite to said first conductivity type and is provided on said main surface, a semiconductor isolation region of said first conductivity type which is formed in said semiconductor layer and which reaches to said main surface to form first and second island portions of said semiconductor layer, a plurality of semiconductor regions for a first amplifier circuit which are of said first conductivity type and are formed in said first island portion, a plurality of semiconductor regions for a second amplifier circuit which are of said first conductivity type and are formed in said second island portion, an insulating layer which is provided on said semiconductor isolation region and which includes first and second insulating layer portions formed on said first and second semiconductor island regions, respectively, a first connecting pad which is formed on the first insulating layer portion of said insulating layer and which is electrically connected to at least one of said semiconductor regions for said first amplifier circuit to provide a predetermined reference potential to said first amplifier circuit, a second connecting pad which is formed on the second insulating layer portion of said insulating layer spaced from said first portion and which is electrically connected to at least one of said semiconductor regions for said second amplifier circuit to provide said predetermined reference potential to said second amplifier circuit, a third connecting pad which is formed on a part of said semiconductor isolation region adjacent to said one of said semiconductor regions for said first amplifier circuit and which is electrically contacted to said part of said semiconductor isolation region to provide said predetermined reference potential to said semiconductor isolation region, and a conductive layer formed on said insulating layer and which is electrically contacted to said third connecting pad and another part of said semiconductor isolation region adjacent to said one of said semiconductor regions for said second amplifier circuit and which is electrically contacted to said other part of said semiconductor isolation region.

14. A semiconductor integrated circuit according to claim 13, wherein said reference potential is a ground potential.

15. A semiconductor integrated circuit device according to claim 13, wherein said conductive layer comprises aluminum.

* * * * *